United States Patent [19]

Grabbe et al.

[11] Patent Number: 4,832,612
[45] Date of Patent: May 23, 1989

[54] PROTECTIVE CARRIER AND SECURING MEANS THEREFOR

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 107,229

[22] Filed: Oct. 9, 1987

Related U.S. Application Data

[62] Division of Ser. No. 926,024, Oct. 31, 1986, Pat. No. 4,744,009.

[51] Int. Cl.⁴ .............................................. H05K 1/00
[52] U.S. Cl. ...................................... 439/71; 206/328; 439/331
[58] Field of Search .......................... 357/70; 206/328; 439/68–73, 525, 526, 331; 174/52 FP

[56] References Cited

U.S. PATENT DOCUMENTS

| | | | |
|---|---|---|---|
| Re. 30,604 | 5/1981 | Kowalski | 357/70 |
| 4,007,479 | 2/1977 | Kowalski | 357/70 |
| 4,351,580 | 9/1982 | Kirkman et al. | 339/17 |
| 4,354,720 | 10/1982 | Bakermans | 339/75 |
| 4,390,220 | 6/1983 | Benasutti | 339/17 |
| 4,513,353 | 4/1985 | Bakermans et al. | 361/399 |
| 4,535,887 | 8/1985 | Egawa | 206/328 |
| 4,547,794 | 10/1985 | Tang | 357/70 |
| 4,564,880 | 1/1986 | Christ | 361/212 |
| 4,575,747 | 3/1986 | Fritz | 357/70 |
| 4,597,617 | 7/1986 | Enochs | 339/17 |
| 4,696,526 | 9/1987 | Newton et al. | 174/52 FP |
| 4,725,922 | 2/1988 | Matsuoka | 174/52 FP |

FOREIGN PATENT DOCUMENTS

82/00368 2/1982 PCT Int'l Appl. .

*Primary Examiner*—Neil Abrams
*Attorney, Agent, or Firm*—James M. Trygg; Bruce J. Wolstoncroft

[57] ABSTRACT

A protective carrier (2) has a flexible circuit (6) attached thereto, the protective carrier (2) protecting the circuit (6) during transportation and handling thereof. The flexible circuit (6) is attached to the protective carrier (2) in such a manner as to ensure proper registration and to maintain the center of all components in coincidence as dimensional change occurs due to the different temperature coefficient of expansion of each component. The protective carrier (2) can be used to orient, position, and install an integrated circuit chip carrier (8) and lead frame (4) on an interposer socket (30). As the lead frame (4) has a large number of contact zones positioned thereon, contact force is required between the interposer socker (30) and the lead frame (4). Thus, a pressure plate (42) is provided to cooperate with posts (38) and the protective carrier (2) to provide the force required to ensure that a positive electrical connection is effected between the contact zones and the contacts (28) of the interposer socket (30).

6 Claims, 3 Drawing Sheets

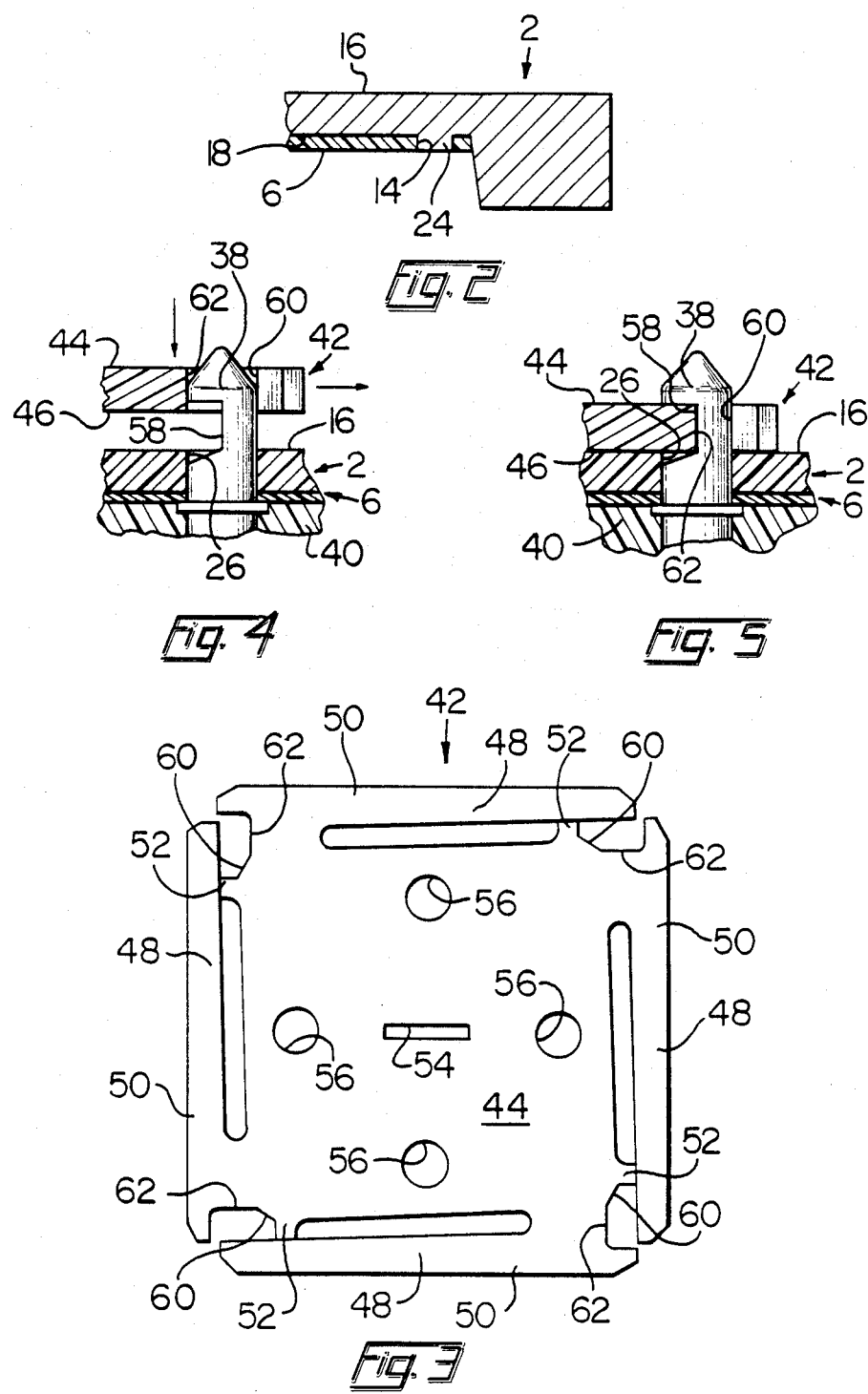

PROTECTIVE CARRIER AND SECURING MEANS THEREFOR

This is a divisional application of application Ser. No. 926,024 filed Oct. 31, 1986 now U.S. Pat. No. 4,744,009.

FIELD OF THE INVENTION

This invention relates to a protective carrier and socket for leaded ceramic packages and more particularly to a protective carrier and socket for use with a flexible printed circuit and to permit an automated process for the entire line of steps from the integrated circuit chip attach through final assembly on a PC board.

BACKGROUND OF THE INVENTION

Integrated circuits (ICs) and other electronic devices are commonly packaged in so-called IC chip carriers. A chip carrier comprises a body of insulating material having the IC chip contained therein and having contact pads at predetermined space locations near its periphery.

As technology in this area is advanced, improved connectors for an IC chip carrier are devised which will allow the connector to accept chip carriers having relatively high numbers of contact positions thereon. With this type of technology being developed, a problem arises. It is hard to ensure that a positive electrical connection is effected between the high density, relatively small contacts of the connector and the high density, relatively small leads of the chip carrier. The dimensions of the chip carrier and connector are so small that any minimal amount of deflection or warpage associated with the chip carrier, the leads, or the connector will result in an unstable and unreliable electrical connection. Therefore, it is important to protect the leads of the chip carrier during transportation and handling and to ensure that the numerous, very closely spaced leads are positioned in the correct locations when high temperature "burn-in" testing occurs. It is also important to ensure that proper contact pressure is applied between the leads of the chip carrier and the terminals of the test site.

SUMMARY OF THE INVENTION

The invention is directed to providing protection of the leads of integrated circuit during shipping and testing thereof. In order for the protective carrier to be useful it must provide an easy means of aligning the numerous leads with contacts of a connector or terminal pads on a PC board. In addition, when a socket is utilized the appropriate force must be supplied to ensure that the electrical connection between the leads and the contacts is effected.

In accordance therewith, a protective carrier is provided for utilizing flexible circuitry, having a chip carrier attached thereto. The protective carrier comprises a housing having a top and a bottom surface. An opening extends through the top and bottom surfaces, the walls of the opening engage sides of the chip carrier to maintain the chip carrier in the opening. At lease one sidewall of the housing extends beyond the bottom surface, forming a cavity with the bottom surface. The flexible circuitry is inserted and maintained in this cavity by securing projections which extend from the bottom surface and cooperate with openings in the circuitry. The flexible circuitry is thereby attached to the protective carrier in proper registration. The circuitry is also attached to the carrier in such a manner that any varied dimensional changes of the circuitry and carrier will maintain the center of each in coincidence. This provides a reliable and accurate reference point which facilitates the positioning of the carrier.

To provide the required contact force between the leads and contacts of a connector, a pressure plate is provided which cooperates with posts attached to the connector. The pressure plate has resilient arms located on the periphery thereof. Openings having internal surfaces essentially parallel to outside edges of arms are located proximate the ends of the arms. The diameter of the posts are greater than the width of the openings. Recesses are provided on one side of the posts proximate the top. The diameter of the posts at the recesses is essentially equal to or less than the width of the openings.

In operation the protective carrier with the integrated circuit and the leads extending therefrom is placed on the connector. The pressure plate with openings in alignment with the posts is placed over the protective carrier, such that as the pressure plate is forced onto the posts, the resilient arms are displaced. This continues until the internal surfaces of the openings are in alignment with the recesses, at which time the internal surfaces are forced into the recesses by the spring force exerted by the displaced arms. This secures the internal surfaces in the recesses, thereby securing the pressure plate in a position in which the required contact force is being maintained by the pressure plate on the leads and the contacts.

BRIEF DESCRIPTION OF THE DRAWINGS

FIG. 2 is a partial cross section taken along line 2—2 of FIG. 1 of the chip carrier with a flexible film attached thereto.

FIG. 3 is a top plan view of the pressure plate.

FIG. 4 is a partial fragmentary view showing the pressure plate just before an inside edge thereof is inserted into a recess of a post attached to a substrate.

FIG. 5 is a view similar to that of FIG. 4 showing the pressure plate inserted into the recess of the post.

DETAILED DESCRIPTION OF THE INVENTION

Figure 1:
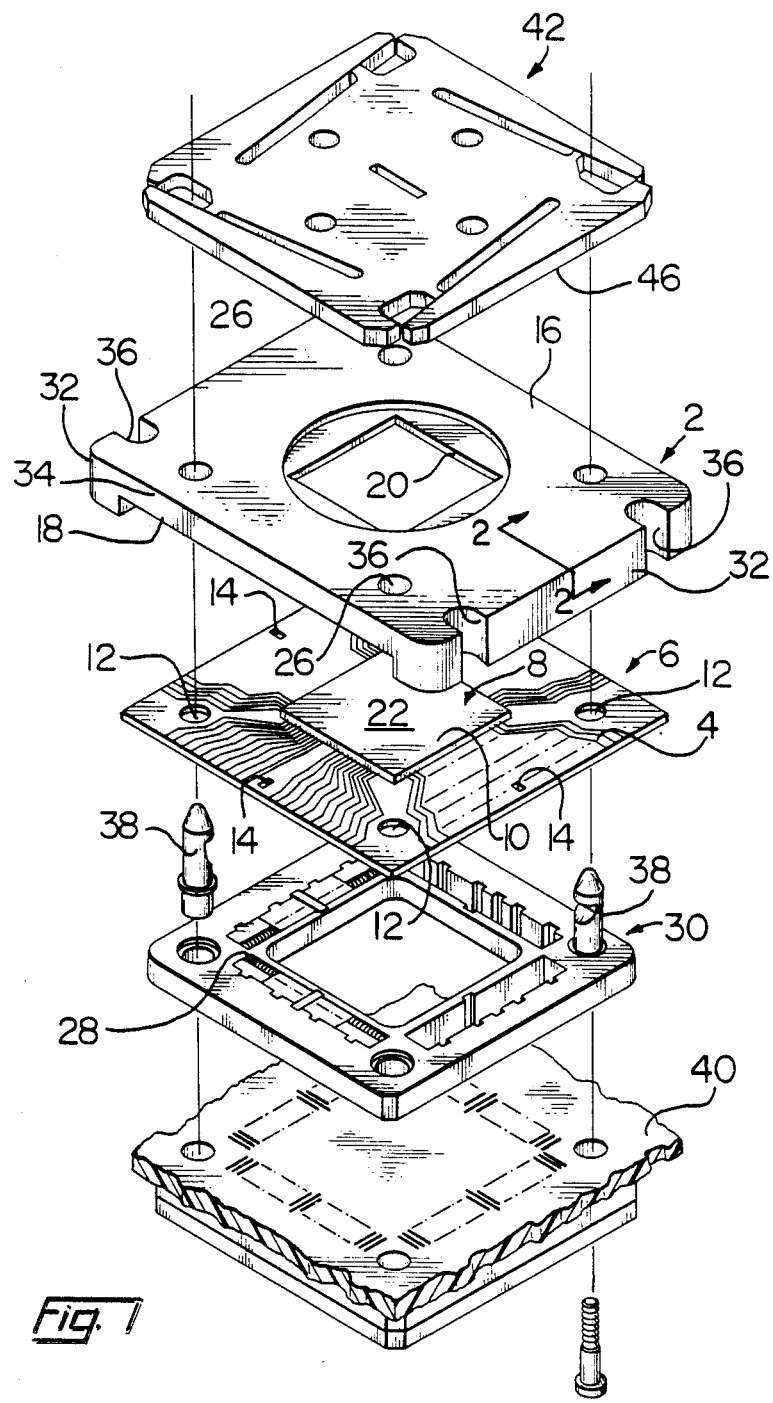
FIG. 1 is an exploded perspective view of a chip carrier and pressure plate of the present invention.

Protective carrier 2, as shown in FIG. 1, is made from plastic, sheet metal, or other material having the required rigidity to protect lead frame 4 of flexible printed circuit 6 during shipping, testing, and operation of chip carrier 8 which contains an integrated chip therein.

Chip carrier 8 is of the leadless variety. Leadless chip carrier 8 is converted to a leaded version by use of flexible printed circuit 6. This is done by placing circuit 6 in engagement with protective carrier 2, and inserting chip carrier 8 through opening 20 of protective carrier 2. Chip carrier 8 is then attached to lead frame 4 of circuit 6 by means of soldering, diffusion bonding, thermo-compression bonding or the like. Lead frame 4 has copper conductors or the like radiating from the center of circuit 6, such that when chip carrier 8 is attached to circuit 6, leadless chip carrier 8 is in essence converted to a leaded chip carrier capable of "burn-in" testing and such. As will be discussed, openings 12 and slots 14 are provided by circuit 6 to enable circuit 6 to be properly secured and oriented during testing and other various operations.

Due to its nature, circuit 6 must be protected in order to insure that lead frame 4 and the integrated chip on chip carrier 8 will not be damaged during handling and testing thereof. Therefore, protective carrier 2 protects circuit 6 from damage while providing a means to enable automation of testing and such without damaging circuit 6. As shown in FIG. 1, protective carrier 2 has a first major surface 16 and a second major surface 18. Second major surface 18 receives flexible printed circuit 6, as will be discussed. Opening 20 extends through protective carrier 2, from first major surface 16 to second major surface 18, as shown in FIG. 1. Opening 20 is dimensioned such that chip carrier 8 will be loosely fitted therein while permitting only minimal movement of the chip carrier within the opening. Circuit 6 is properly received in protective carrier 2 when top surface 22 of chip carrier 8 is essentially coplanar with first major surface 16 of carrier 2. As this occurs, lead frame 4 is received against second major surface 18. Projections 24 extending from second major surface 18, cooperate with slots 14 to secure circuit 6 in this position. Projections 24, as shown in FIG. 2, are positioned proximate all four sides of protective carrier 2. As circuit 6 is brought into position, projections 24 are forced through slots 14, enabling projections 24 to secure circuit 6 to protective carrier 2. As projections 24 and slots 14 are accurately positioned on carrier 2 and circuit 6 respectively, they act as alignment means, ensuring that circuit 6 is properly positioned with respect to protective carrier 2. Consequently, openings 12 of circuit 6 and openings 26 of protective carrier 2 are in alignment when carrier 2 and circuit 6 are secured together.

Projections 24 and slots 14 cooperate to ensure that circuit 6 and protective carrier 2 are in proper registration such that any dimensional change due to temperature coefficient of expansion will maintain the center of all components in coincidence. This is an important aspect of the invention because of the many leads (for example, with as many as 320 on a square carrier which is only 0.950 on each side) and the exact spacing requirements associated therewith. It is therefore critical during testing and operation that the leads of lead frame 4 align with contacts 28 of the testing socket 30, as will be discussed. Maintaining the center of all components provides and important an accurate locating means which makes possible robotic handling of protective carrier 2 during testing and other such operations. Therefore, maintaining the center of all components in coincidence facilitates quick and proper manual placement of carrier 2, as well as robotic handling of carrier 2.

Essential to the protection of flexible circuit 6 is the configuration of sidewalls 32, 34. As shown in FIG. 1, sidewalls 32 extend from opposite sides of protective carrier 2, projecting from first major surface 16 beyond second major surface 18. However, sidewalls 34 extend from first major surface 16 to second major surface 18 and not beyond. Consequently, sidewalls 32 act as a type of protective guard, preventing circuit 6 from being damaged. Sidewalls 32 also facilitate stacking of protective carriers 2 during shipping and storage. As sidewalls 32 extend beyond circuit 6, circuit 6 is protected against accidental contact.

Figure 6:
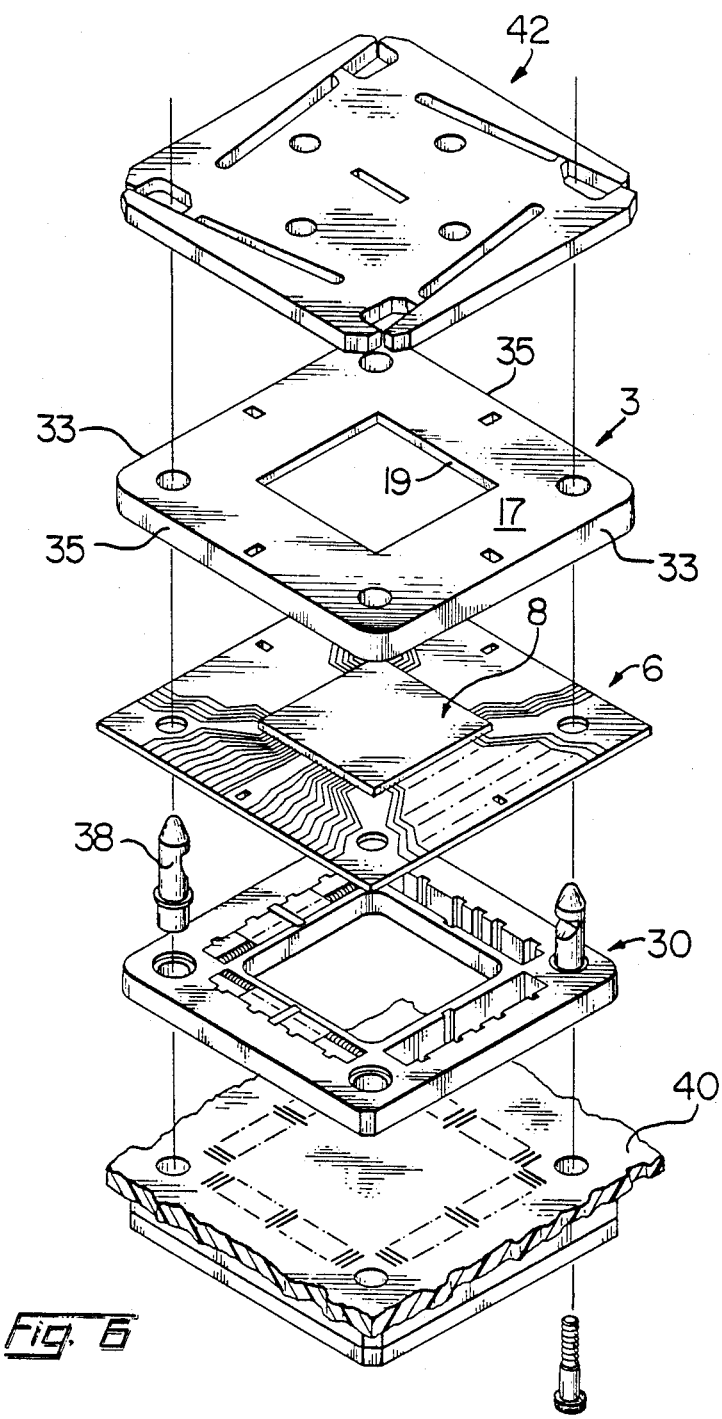
FIG. 6 is an exploded perspective view of of an alternative chip carrier and the pressure plate.

An alternative embodiment of a protective carrier 3 is shown in FIG. 6. Protective carrier 3 is identical to that of carrier 2, with the exception that all sidewalls 33, 35 extend from first major surface 17 beyond second major surface 19. The circuit is protected in the same manner as previously described. This configuration is best suited for use with a metallic material.

These variations of the sidewalls are not deemed to be inclusive, but are merely provided to demonstrate that some portion of the sidewalls must extend past the second major surface in order to provide the protection necessary to prevent the flexible circuit from being damaged during shipping, testing, storing, and operation of the protective carrier. The sidewalls and the bottom surface form a type of cavity in which the flexible circuit is positioned.

Recesses 36 (FIG. 1) are provided in sidewalls 32 to allow for robotic handling of protective carrier 2. Recesses 36 are positioned to allow a robotic handling device (not shown) to pick up carrier 2 and position it accurately. The configuration of recesses 36 may vary but must correspond to the robotic handling device which is to be used.

Protective carrier 2 reduces the physical damage done to lead frame 4 and the integrated circuit during transportation thereof. This allows protective carrier 2 to be handled much faster and with less cost as damage to lead frame 4 is virtually eliminated.

Protective carrier 2 is assembled and transported to be placed in operation. Before the integrated circuit can be placed in operation, testing must be performed to verify the quality of the integrated circuit. One such test apparatus, as shown in FIG. 1, is of the type described in U.S. Patent No. 4,699,593 which issued Oct. 13, 1987 to Grabbe et al. Protective carrier 2 is installed on interposer socket 30. Posts 38 extend through openings 12 of circuit 6 and protective carrier 2. This provides proper orientation of contacts 28 of interposer socket 30 with the leads of lead frame 4 of circuit 6. As interposer socket 30 is already in electrical contact with substrate 40 when protective carrier 2 is properly mounted thereon, an electrical connection is formed between the integrated chip and substrate 40.

The use of interposer socket 30 is made practical because lead frame 4 will carry a large number of leads in comparison to the space available. In fact, the outer portion of lead frame 4 will usually contain 320 test points. Depending on the chip carrier being used not all test points will proceed toward the center. This allows a single interposer socket (with 320 contacts) to perform burn-in and testing of varying integrated circuits having any possible lead count under 320.

A problem with using this protective carrier 2 on a test site of the type described or any other test site, is the contact force required to electrically connect the numerous leads of lead frame 4 to contacts 28 of socket 30 is great and therefore, more contact force is required than can be generated by interposer socket 30 and protective carrier 2. To remedy this problem a pressure plate 42 is provided.

Pressure plate 42, as best shown in FIG. 3, is made from any material capable of withstanding the high temperatures of burn-in while maintaining its mechanical strength and integrity. This is important because if protective carrier 2 is made from plastic, pressure plate 42 must support the plastic as high temperatures are reached.

Unlike protective carrier 2, pressure plate 42 remains at the test site. The purpose of pressure plate 42 is to support protective carrier 2 and to provide and maintain the required contact force to ensure electrical connection between contacts 28 and lead frame 4. Both of these operations are needed only at the test site and consequently, pressure plate 42 remains at the site. As pressure plate 42 is made of material which maintains its mechanical strength and integrity, pressure plate 42 can be used for many cycles before being discarded.

Pressure plate 42 is essentially rectangular in shape having a top surface 44 and a bottom surface 46. Cantilever spring arms 48 are integral with side walls 50 of pressure plate 42. Overstress members 52 are provided by pressure plate 42 to ensure that arms 48 cannot be pushed inward further than members 52 allow, diminishing the possibility of arms 48 being damaged or broken. Members 52 also prevent arms 48 from being rotated too far, which would cause arms 48 to take a permanent set, as will be discussed. Arms 48 cooperate with posts 38 to secure protective carrier 2 in place on interposer socket 30, as will be discussed.

Provided proximate the center of pressure plate 42 is a slot 54 which allows manual release of pressure plate 42 from posts 38 by use of a screwdriver. Openings 56 positioned circularly around slot 54 are also used for release of pressure plate 42 from posts 38. However, openings 56 are generally provided to allow for robotic removal of pressure plate 42 from posts 38. Both of these will be discussed more fully below.

Posts 38, best shown in FIG. 4 or FIG. 5, are generally circular in shape, the tops of which are bullet-shaped. Recess 58 is provided proximate the top of each post 38 such that as pressure plate 42 is inserted onto posts 38, pressure plate 42 cooperates with recesses 58 to secure pressure plate 42 in place, providing the contact force necessary to ensure that a positive electrical connection is effected between lead frame 4 and contacts 28.

In operation, protective carrier 2, with lead frame 4 and the integrated circuit attached, arrives at the test site and is inserted onto interposer socket 30 by aligning openings 26 of carrier 2 with posts 38 of socket 30, as was previously described.

Pressure plate 42 is positioned over posts 38 such that openings 60 are in alignment with posts 38. It should be noted that the diameter of posts 38 is larger than the width of openings 60. However, the diameter of posts 38 where recesses 58 are located is essentially equal to or smaller than the width of openings 60. As shown in FIG. 4, pressure plate 42 is forced downward, toward protective carrier 2, causing plate 42 to engage posts 38. As posts 38 are larger than openings 60, arms 48 are displaced, allowing insertion of pressure plate 42 onto posts 38 of socket 30 to continue.

Insertion continues until plate 42 comes into contact with recesses 58 of posts 38, shown in FIG. 5. As this occurs surfaces 62 of plate 42 are moved into recesses 58 by the spring force built up in arms 48. This results in a slight counter clockwise rotation of plate 42 relative to carrier 2. With surfaces 62 in recesses 58, pressure plate 42 is securely held in place on posts 38.

As insertion of plate 42 onto posts 38 occurs, bottom surface 46 of plate 42 contacts carrier 2 and exerts force thereon. Consequently, when plate 42 is fully inserted on posts 38, enough force is exerted by plate 42 onto carrier 2 to ensure that a positive electrical connection is effected between contacts 28 and leads of lead frame 4. The carrier 2 is retained in this position until the tests have been completed.

To remove pressure plate 42 from posts 38, plate 42 must be rotated clockwise, such that surfaces 62 are free of recesses 58. Several means are provided for this purpose. Slot 54 allows for manual release of plate 42. By merely putting a screw driver or the like in slot 54 and turning, release of plate 42 can be accomplished. For robotic release, openings 56 are provided. A robotic carrier engages openings 56 and rotates plate 42 such that plate 42 is disengaged from posts 38. During either removal process, plate 42 is turned causing arms 48 to be placed in a stress position. Consequently, enough force must be applied during removal to overcome the spring force of arms 48. Plate 42 is prevented from overrotation by guards 52. As plate 42 is rotated past the point required for removal of plate 42 from post 38, guards 52 engage posts 38, thereby preventing plate 42 from overrotation, ensuring that arms 48 will not take a permanent set from overrotation. After plate 42 has been disengaged, protective carrier 2 is merely lifted off interposer socket 30, allowing arms 48 to resiliently move to their unstressed position.

We claim:

1. a protective carrier for use with flexible circuitry having a chip carrier attached thereto and for aligning said chip carrier to said flexible circuitry during attachment thereto, the protective carrier comprising;

housing means having a top surface and a bottom surface; an opening provided in the housing means extending through the top and bottom surfaces, the opening sized to cooperate with the chip carrier to allow only minimal movement of the chip carrier in the opening thereby aligning it with said flexible circuitry for attachment thereto;

at least one sidewall of the housing means extends from the top surface beyond the bottom surface, the sidewall and the bottom surface forming a cavity in which the flexible circuitry is inserted;

securing means provided by the housing means and the flexible circuitry to accurately position and secure the flexible circuitry in the cavity in proper registration to the protective carrier such that any varied dimensional changes of the circuitry and the protective carrier, due to different coefficients of expansion of the circuitry and the protective carrier, will maintain the centers of the circuitry and the protective carrier in coincidence, giving the protective carrier and the circuitry a reliable and accurate reference point, facilitating the positioning of the protective carrier onto a connection means.

2. A protective carrier as recited in claim 1, wherein openings are provided in the protective carrier and the circuitry, the openings are in alignment when the circuitry is attached to the carrier.

3. A protective carrier as recited in claim 1, wherein recesses are provided in the sidewalls of the protective carrier, the recesses being provided to facilitate robotic handling of the carrier.

4. A protective carrier as recited in claim 1, wherein one pair of opposing sidewalls extends beyond the bottom surface.

5. A protective carrier as recited in claim 1, wherein all four sidewalls extend beyond the bottom surface.

6. A protective carrier as recited in claim 1, wherein the securing means comprises projections extending from the bottom surface into the cavity and openings provided in the flexible circuitry, the projections extend through the openings to position and secure the flexible circuitry to the protective carrier.

* * * * *